United States Patent [19]
Ono et al.

[11] Patent Number: 5,684,486
[45] Date of Patent: Nov. 4, 1997

[54] FLASH A/D CONVERTER

[75] Inventors: Koichi Ono, Kokubunji; Masumi Kasahara, Takasaki; Eiki Imaizumi, Kodaira; Tatsuji Matsuura, Tokyo; Hisashi Okazawa, Akishima, all of Japan

[73] Assignees: Hitachi, Ltd.; Hitachi ULSI Engineering Corporation, both of Tokyo, Japan

[21] Appl. No.: 595,999

[22] Filed: Feb. 6, 1996

[30] Foreign Application Priority Data

Feb. 6, 1995 [JP] Japan .................... 7-017810

[51] Int. Cl.$^6$ .................................... H03M 1/36
[52] U.S. Cl. .......................... 341/159; 341/135
[58] Field of Search ........................ 341/159, 155, 341/160, 133, 135

[56] References Cited

U.S. PATENT DOCUMENTS 4,608,555  8/1986  Hoeft ........................ 341/133
5,307,067  4/1994  Kimura et al. .

FOREIGN PATENT DOCUMENTS

A-6-29852  2/1994  Japan .

OTHER PUBLICATIONS

Hiroshi Kimura, et al., "A 10b 300MHz Interpolated–Parallel A/D Converter", Technical Reports of IECIE, ICD92–19, pp. 1–8, 1992.

Hiroshi Kimura et al., "A 10b 300MHz Interpolated–Parallel A/D Converter", 1992 Symposium on VLSI Circuits Digest of Technical Papers, pp. 94–95.

*Primary Examiner*—Brian K. Young
*Attorney, Agent, or Firm*—Antonelli, Terry, Stout & Kraus, LLP.

[57] ABSTRACT

A flash A/D converter includes a plurality of master comparators for comparing a plurality of reference voltages and an input analog signal to absorb a current with a constant value from a non-inverted output or inverted output of each master comparator, a plurality of constant current sources, a plurality of load resistors and a plurality of slave comparators for outputting desired digital signals. The constant current value of one of the constant current sources coupled to a signal line coupled to the input of the slave comparator of a lower bit side is set to a value larger than that of one of the constant current sources coupled to a signal line coupled to the input of the slave comparator of a higher bit side. Thereby, it is possible to provide a flash A/D converter which has a low power consumption and a high speed.

7 Claims, 6 Drawing Sheets

FLASH A/D CONVERTER

BACKGROUND OF THE INVENTION

The present invention relates to an A/D converter, and more particularly to a technique having an effective application thereof to a flash A/D converter which has a high conversion speed and a wide input band.

Recently, in a record apparatus such as a hard disc apparatus, digital VTR, optical disc or the like, a signal processing called PRML (Partial Response Maximum Likelihood) has come into the limelight.

The PRML signal processing is a technique which enhances a recording density by 1.2 to 1.5 times through a signal processing without greatly changing the conventional recording/play back system.

FIG. 6 is a diagram for explaining the outline of the PRML signal processing circuit.

In the PRML signal processing circuit shown in FIG. 6, a write signal to a record medium 610 such as a hard disc apparatus is generated from an input signal chain from a hard disc controller (HDC) or the like through a recording encoder 601, a precoder 602 and a write compensation circuit 603. An output signal chain to the hard disc controller (HDC) or the like is reproduced from a read signal from the record medium 610 through an automatic gain control circuit (AGC) 604, a low pass filter 605, an A/D converter 606, a PR (Partial Response) equalizer 607, a Viterbi decoding circuit 608 and a recording decoder 609.

The low pass filter 605 eliminates high frequency noises of an output of the A/D converter 606. The PR equalizer 607 causes an intentional signal interference between adjacent signals which is convenient for the Viterbi decoding circuit 608. The Viterbi decoding circuit 608 operates to turn the signal interference back.

A decoding circuit for a tracking servo signal and a timing control circuit for the A/D converter 606 are omitted from the illustration of FIG. 6.

One of techniques of increasing the speed of the PRML signal processing includes increasing the conversion speed of the A/D converter 606.

A flash A/D conversion system is known as a conversion system which is the most suitable for increasing the conversion speed of the A/D converter.

In the case where an input analog signal is converted into a 8-bit digital signal, the flash A/D conversion system is constructed such that 256 resistors are connected in series to generate 256 levels of reference voltages and an analog input signal having a certain level is simultaneously compared with those reference signals by 256 comparators in synchronism with a clock signal.

For example, assume that a full-scale analog input is 8V and an analog input voltage is V1. In a state of V1=0, the output of each of the comparators takes a "low" level.

When a step voltage of 5V is now applied as the analog input voltage V1 (V1=5V), all of the outputs of the comparators corresponding to the reference voltages lower than 5V take a "high" level and all of the outputs of the comparators corresponding to the reference voltages higher than 5V take a "low" level.

In the flash A/D conversion system, a changing point from the "high" level to the "low" level is detected and is converted into a binary code by use of an encoder circuit.

The flash A/D conversion system has a problem that when the number of bits is increased, the circuitry scale is logarithmically increased to bring about an increase in power consumption.

In order to solve the above problem, the conventional flash A/D converter uses a folded differential logic circuit to prevent the increase in circuitry scale, thereby realizing a flash A/D converter which has a low power consumption and high speed. Such a flash A/D converter is disclosed by the following reference (1): H. Kimura et al, "A 10b 300 MHz Interpolated-Parallel A/D Converter", Technical Reports of IECIE, ICD92-19, pp. 1–8, 1992.

References equivalent to the reference (1) include (2) H. Kimura et al, "A 10b 300 MHz Interpolated-Parallel A/D converter", 1992 Symposium on VLSI Circuits Digest of Technical Papers, pp. 94–95, (3) U.S. Pat. No. 5,307,067 and (4) JP-A-6-29852.

In the flash A/D converter with folded differential logic circuit disclosed by the reference (1), a gray code is directly generated by superimposing the current outputs of a plurality of master comparator latches (MCL's) so that they are received by one slave latch (SL).

Thereby, it becomes possible to reduce the number of slave latches (SL's) and to eliminate all logic gates for detecting a changing point in the comparator outputs.

FIG. 7 is a diagram showing a simplified version of the circuit construction of the flash A/D converter with folded differential logic circuit disclosed by the reference (1).

FIG. 7 shows the A/D converter in conjunction with the case where an input analog signal is converted into a 3-bit digital signal.

In FIG. 7, reference numeral 1 denotes a resistors-chain circuit including eight resistors, numeral 5 pre-amplifiers, numerals 100 to 106 master comparator latches, numerals 30 to 32 slave latches, numerals 40 to 45 load resistors having a resistance value of R, numerals 50 and 51 constant current sources having a current value of Io, symbols VRT and VRB reference voltage supply terminals, symbol Vin an input analog voltage, symbols Vref1 to Vref7 reference voltages generated by the resistors-chain circuit 1, and symbols D0, D1 and D2 the outputs of the slave latches 30, 31 and 32.

In FIG. 7, a voltage having a high potential level is applied to the reference voltage supply terminal VRT and a voltage having a low potential level is applied to the reference voltage supply terminal VRB. Therefore, the reference voltages Vref1 to Vref7 generated by the resistors-chain circuit 1 satisfy the relation of Vref1<Vref2<Vref3<Vref4<Vref5<Vref6<Vref7.

As disclosed by the reference (1), the master comparator latch (100–106) is constructed by series-connected ECL (Emitter Coupled Logic) circuits called an ECL series gate. In the ECL series gate, it is well known that the current of Io substantially equal to the constant current source Io connected to the common emitters of a pair of bi-polar transistors forming differential outputs flows to only the collector of one of the paired bi-polar transistors in accordance with differential inputs.

Accordingly, provided that Vref is each reference voltage (Vref1 to Vref7) inputted to the master comparator latch (100–106) and one of differential outputs of the ECL series gate and the other thereof are respectively defined as a non-inverted output and an inverted output, the operation of the master comparator latch (100–106) will be defined as follows.

If Vin<Vref, the non-inverted output absorbs the current of Io.

If Vin>Vref, the inverted output absorbs the current of Io.

The operation of the A/D converter shown in FIG. 7 will now be explained.

First, explanation will be made of the operation when the input analog voltage Vin is Vin<Vref1.

At this time, the non-inverted output of each of the master comparator latches 100 to 106 absorbs the current of Io. Accordingly, there flows through the load resistor 40 the current of 2Io which corresponds to the sum of the current of Io flowing into the non-inverted output of the master comparator latch 102 and the current of Io flowing into the non-inverted output of the master comparator latch 106. Also, there flows through the load resistor 41 the current of 3Io which corresponds to the sum of the current of Io flowing into the non-inverted output of the master comparator latch 100, the current of Io flowing into the non-inverted output of the master comparator latch 104 and the current of Io flowing through the constant current source 51.

Accordingly, the load resistor 40 has a voltage drop of 2Io×R developed thereacross and the load resistor 41 has a voltage drop of 3Io×R developed thereacross. Consequently, voltages VD0N and VD0P generated at the load resistors 40 and 41 are VD0P<VD0N with a voltage difference of Io×R therebetween.

Similarly, there flows through the load resistor 42 the current of Io which flows into the non-inverted output of the master comparator latch 105. Also, there flows through the load resistor 43 the current of 2Io which corresponds to the sum of the current of Io flowing into the non-inverted output of the master comparator latch 101 and the current of Io flowing through the constant current source 50.

Accordingly, the load resistor 42 has a voltage drop of Io×R developed thereacross and the load resistor 43 has a voltage drop of 2Io×R developed thereacross. Consequently, voltages VD1N and VD1P generated at the load resistors 42 and 43 are VD1P<VD1N with a voltage difference of Io×R therebetween.

Similarly, no current flows through the load resistor 44. Also, there flows through the load resistor 45 the current of Io which flows into the non-inverted output of the master comparator latch 103.

Accordingly, the load resistor 45 has a voltage drop of Io×R developed thereacross. Consequently, voltages VD2N and VD2P generated at the load resistors 44 and 45 are VD2P<VD2N with a voltage difference of Io×R therebetween.

Next, explanation will be made of the operation when the input analog voltage Vin is Vref1<Vin<Vref2.

At this time, the inverted output of the master comparator latch 100 absorbs the current of Io and the non-inverted output of each of the other master comparator latches 101 to 106 absorbs the current of Io. Accordingly, there flows through the load resistor 40 the current of 3Io which corresponds to the sum of the current of Io flowing into the non-inverted output of the master comparator latch 102, the current of Io flowing into the non-inverted output of the master comparator latch 106 and the current of Io flowing into the inverted output of the master comparator latch 100. Also, there flows through the load resistor 41 the current of 2Io which corresponds to the sum of the current of Io flowing into the non-inverted output of the master comparator latch 104 and the current of Io flowing through the constant current source 51.

Accordingly, the load resistor 40 has a voltage drop of 3Io×R developed thereacross and the load resistor 41 has a voltage drop of 2Io×R developed thereacross. Consequently, voltages VD0N and VD0P generated at the load resistors 40 and 41 are VD0N<VD0P with a voltage difference of Io×R therebetween.

Currents flowing through the remaining load resistors 42 to 45 are the same as those in the case where Vin<Vref1.

Next, explanation will be made of the operation when the input analog voltage Vin is Vref2<Vin<Vref3.

At this time, the inverted output of each of the master comparator latches 100 and 101 absorbs the current of Io and the non-inverted output of each of the other master comparator latches 102 to 106 absorbs the current of Io. Accordingly, there flows through the load resistor 42 the current of 2Io which corresponds to the sum of the current of Io flowing into the non-inverted output of the master comparator latch 105 and the current of Io flowing into the inverted output of the master comparator latch 101. Also, there flows through the load resistor 43 the current of Io which flows through the constant current source 50.

Accordingly, the load resistor 42 has a voltage drop of 2Io×R developed thereacross and the load resistor 43 has a voltage drop of Io×R developed thereacross. Consequently, voltages VD1N and VD1P generated at the load resistors 40 and 41 are VD1N<VD1P with a voltage difference of Io×R therebetween.

Currents flowing through the remaining load resistors 40, 41, 44 and 45 are the same as those in the foregoing case.

Next, explanation will be made of the operation when the input analog voltage Vin is further changed so that it is Vref4<Vin.

At this time, the inverted output of each of the master comparator latches 100 to 103 absorbs the current of Io and the non-inverted output of each of the other master comparator latches 104 to 106 absorbs the current of Io. Accordingly, there flows through the load resistor 44 the current of Io which flows into the inverted output of the master comparator latch 103. Also, no current flows through the load resistor 45.

Accordingly, the load resistor 44 has a voltage drop of Io×R developed thereacross. Consequently, voltages VD2N and VD2P generated at the load resistors 44 and 45 are VD2N<VD2P with a voltage difference of Io×R therebetween.

FIG. 8 shows a voltage change which is generated at each of the resistors 40 to 45 in the A/D converter of FIG. 7 in accordance with the input analog voltage Vin.

As apparent from FIG. 8, the voltage VD0P generated at the load resistor 41, the voltage VD1P generated at the load resistor 43 and the voltage VD2P generated at the load resistor 45 provide gray codes themselves.

With this flash A/D converter with the folded differential logic circuit, it becomes possible to realize an A/D converter which has a high speed and a reduced power consumption.

SUMMARY OF THE INVENTION

However, the present inventors' examination have demonstrated that the above-mentioned flash A/D converter with the folded differential logic circuit has the following problems.

(1) Since the current output of the master comparator latch is directly applied to the load resistor, the DC operating voltage margin of the master comparator latch is narrowed to bring about a limitation on the number of master comparator latches which can be superimposed.

Namely, the master comparator latch is constructed by series-connected ECL circuits called an ECL series gate, as mentioned above. Accordingly, a high DC operating voltage is required in accordance with the number of series-connected bi-polar transistors of the ECL series gate.

In the flash A/D converter with the folded differential logic circuit, on the other hand, the number of the outputs of the most master comparator latches connected to the non-inverted input VD0P and the inverted input VD0N of the slave comparator latch (30 in FIG. 7) of the least significant bit (D0) is the most. Therefore, the largest voltage drops are developed across the load resistors 40 and 41 associated with the least significant bit (D0).

Accordingly, when a supply voltage VCC is 5V, the series-connected bi-polar transistors of the master comparator latch of the least significant bit (D0) may operate in a saturation region in the worst case, thereby offering the problem of a signal delay associated with the saturated operation or an increase in power consumption caused by a substrate current.

(2) A signal line for connecting the current outputs of the master comparator latches is drawn in an elongated form on a chip layout, which brings about an increase in parasitic capacitance of the signal line to deteriorate the high-speed transmission of superimposed logic signals.

Namely, the output of the master comparator latch constructed by the ECL series Gate is the collector of the bi-polar transistor, as mentioned above. On the other hand, it is required that the outputs of plural master comparator latches should be connected to the inputs of plural slave comparator latches through long signal lines, as shown in FIG. 7.

Accordingly, the collector outputs of the plural master comparator latches have large parasitic capacitances of the long signal lines. The high-speed operation is deteriorated due to a time constant which is determined by the product of the parasitic capacitance and the load resistor.

An object of the present invention made for solving the above-mentioned problems Of the prior art is to provide a technique in which the attainment of a high speed and a further reduction in power consumption are possible in a flash A/D converter without limiting the number of comparators which can be superimposed.

The above and other objects and novel features of the present invention will be made apparent by the disclosure of the specification of the present application and the accompanying drawings.

The outline of typical ones of inventions disclosed by the present application can be summarized as follows.

(1) A flash A/D converter disclosed in the present application comprises a plurality of master comparators for comparing a plurality of reference voltages and an input analog signal to absorb a current with a constant value from a non-inverted output or inverted output of each of the master comparators in accordance with a relation in magnitude between the reference voltage and the input analog signal, a plurality of slave comparators having inputs thereof selectively connected to the non-inverted outputs or inverted outputs of the plurality of master comparators through a plurality of signal lines, the plurality of slave comparators outputting desired digital signals, a plurality of constant current sources corrected to the plurality of signal lines, respectively, and a plurality of load resistors having their first ends connected to the plurality of signal lines respectively and their second ends opposite to the first ends, wherein a common DC bias voltage is applied to the second ends of the plurality of load resistors and wherein the constant current value of one of the plurality of constant current sources connected to the signal line connected to the input of the slave comparator of a lower bit side is set to a value larger than that of one of the plurality of constant current sources connected to the signal line connected to the input of the slave comparator of a higher bit side.

(2) Another flash A/D converter disclosed in the present application comprises a plurality of master comparators for comparing a plurality of reference voltages and an input analog signal to absorb a current with a constant value from a non-inverted output or inverted output of each of the master comparators in accordance with a relation in magnitude between the reference voltage and the input analog signal, a plurality of signal lines selectively connected to the non-inverted outputs or inverted outputs of the plurality of master comparators, a plurality of current mirror circuits having inputs connected to the plurality of signal lines, a plurality of load resistors having their first ends connected to the outputs of the plurality of current mirror circuits and their second ends connected to a reference potential point, and a plurality of slave comparators having inputs thereof connected to the outputs of the plurality of current mirror circuits and the first ends of the plurality of load resistors, the plurality of slave comparators outputting desired digital signals.

According to the above-mentioned means (1), the plurality of constant current sources and the plurality of load resistors are connected to the signal lines which interconnect the non-inverted outputs or inverted outputs of the master comparators, and the constant current value of one of the plurality of constant current sources connected to the signal line connected to the input of the slave comparator of the lower bit side is set to a value larger than that of one of the constant current sources connected to the signal line connected to the input of the slave comparator of the higher bit side.

Therefore, an extremely large voltage drop is not generated even at the load resistor connected to the input of the slave comparator of the lower bit side. As a result, there is eliminated the problem that the DC operating voltage margin of the master comparator becomes narrow.

According to the above-mentioned means (2), the non-inverted outputs or inverted outputs of the plurality of master comparators are transmitted to the plurality of load resistors and the inputs of the plurality of slave comparators through the inputs and outputs of the plurality of current mirror circuits.

As well known, a change in voltage of the output of the current mirror circuit gives no influence on the input side thereof. Therefore, even if a large voltage drop is generated at the load resistor connected to the input of the slave comparator of the lower bit side, the DC operating voltage margin of the master comparator on the input side of the current mirror circuit is not affected.

DESCRIPTION OF THE PREFERRED EMBODIMENTS

Figure 1:
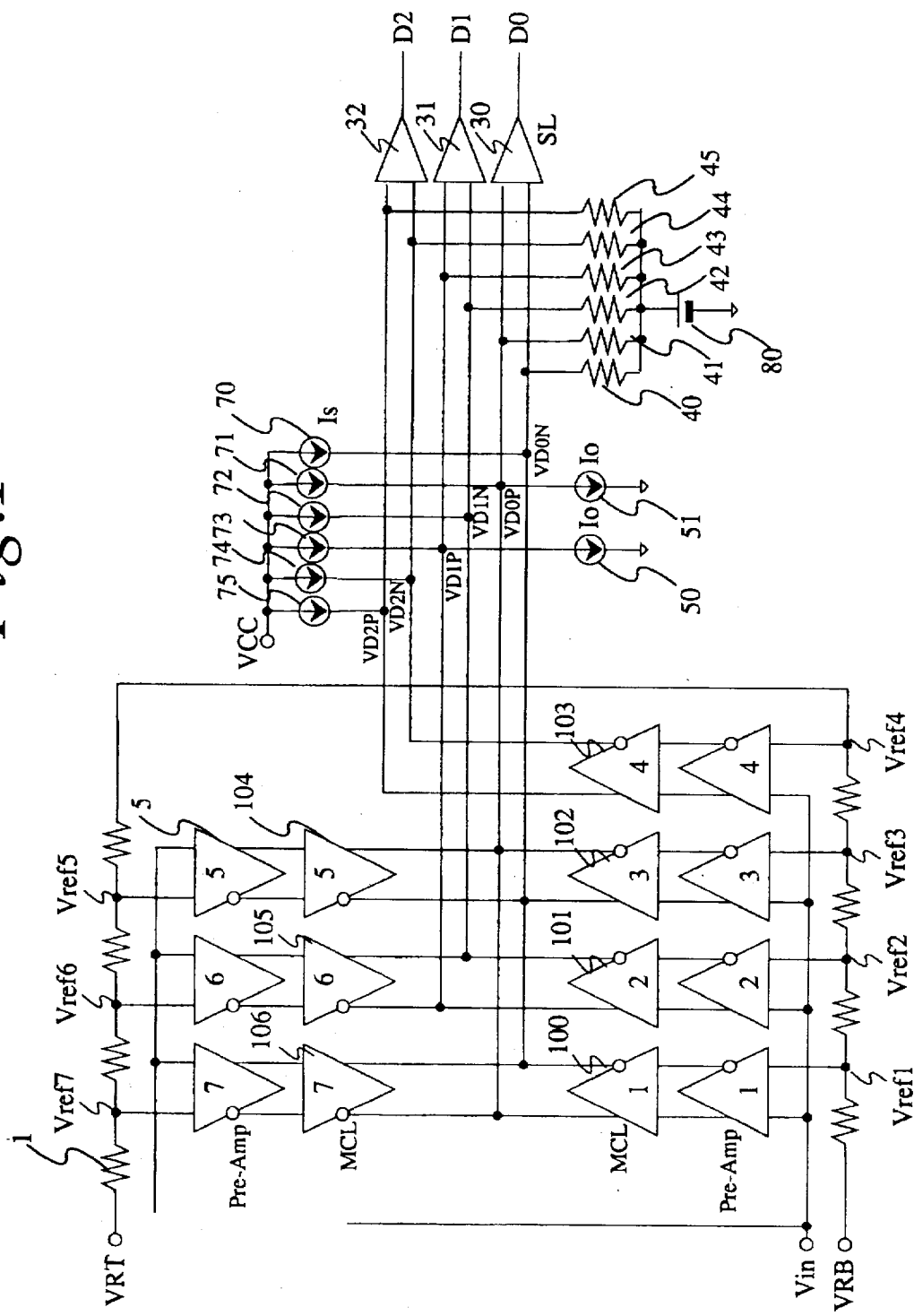
FIG. 1 is a circuit diagram showing the construction of a flash A/D converter with folded differential logic circuit according to one or first embodiment of the present invention.

Embodiments of the present invention will now be described in detail by use of the drawings.

Through all figures for explaining the embodiments, components having the same functions are denoted by the same reference numerals or symbols. Therefore, repeated explanation will be omitted.

[Embodiment 1]

FIG. 1 is a circuit diagram showing the construction of a flash A/D converter with folded differential logic circuit according to one or first embodiment of the present invention.

FIG. 1 shows the A/D converter in conjunction with the case where an input analog signal is converted into a 3-bit digital signal.

Figure 2:
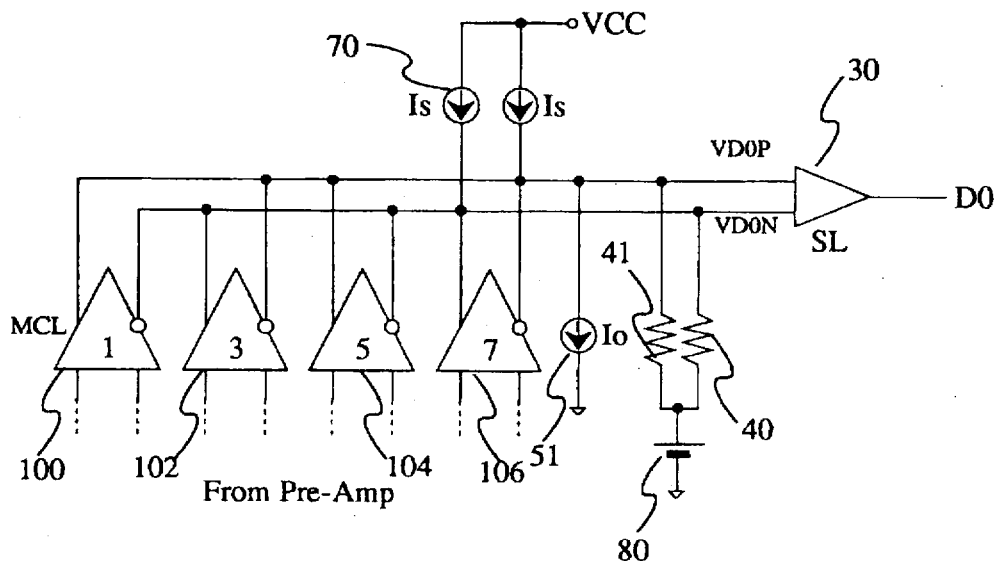
FIG. 2 is a circuit diagram showing the construction of only the least significant bit of the A/D converter shown in FIG. 1.

In order to facilitate the understanding, the circuit construction of only the least significant bit of the A/D converter is shown in FIG. 2.

In FIGS. 1 and 2, reference numeral 1 denotes a resistors-chain circuit, numeral 5 pre-amplifiers, numerals 100 to 106 master comparator latches, numerals 30 to 32 slave latches, numerals 40 to 45 load resistors having a resistance value of R, numerals 50 and 51 constant current sources having a current value of Io, numerals 70 to 75 constant current sources having current values of Is, numeral 80 a fixed bias, symbols VRT and VRB reference voltage supply terminals, symbol Vin an input analog voltage, symbols Vref1 to Vref7 reference voltages generated by the resistors-chain circuit 1, symbol VCC a supply voltage, and symbols D0, D1 and D2 the outputs of the slave latches 30, 31 and 32. The master comparator latches 100 to 106 and the slave latches 30 to 32 are constructed by series-connected ECL circuits called ECL series gates, in the same manner as that disclosed by the reference (1).

Figure 7:
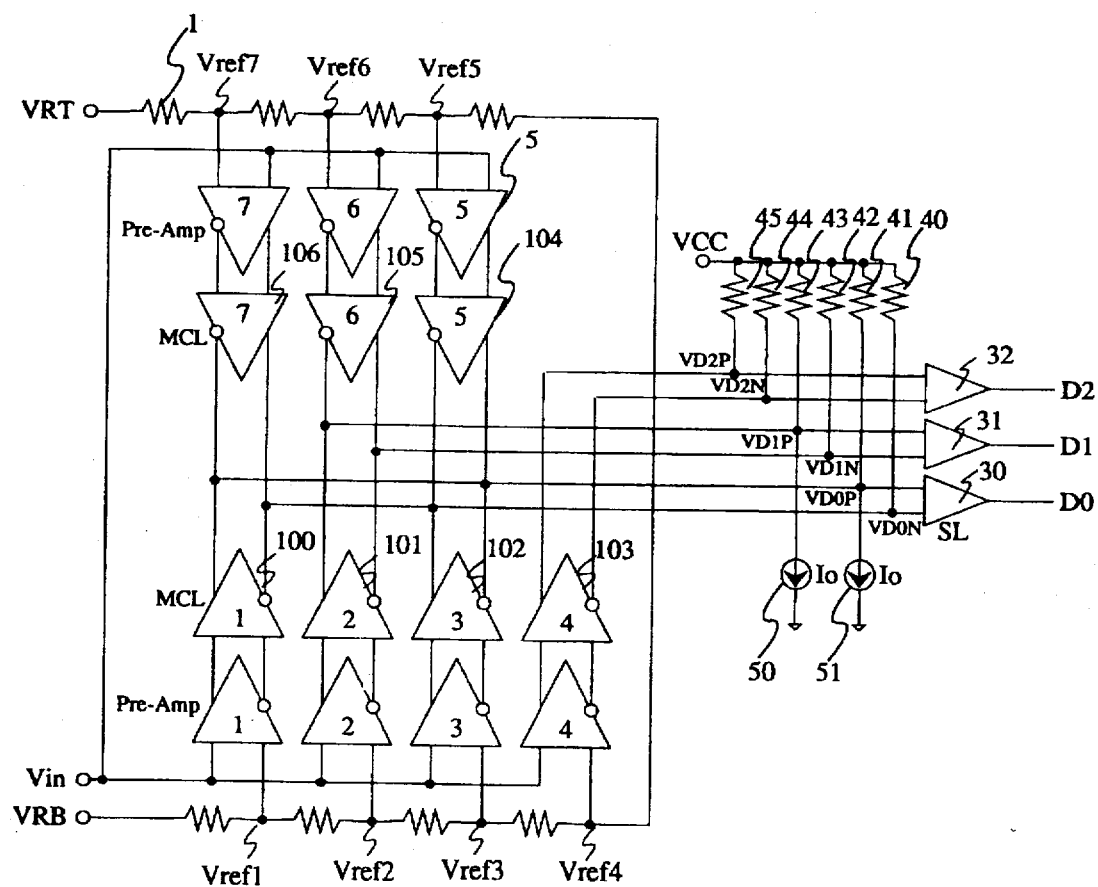
FIG. 7 is a circuit diagram showing the construction of a flash A/D converter with folded differential logic circuit.

As in the case of FIG. 7, it is assumed in FIG. 1 that a voltage having a high potential level is applied to the reference voltage supply terminal VRT and a voltage having a low potential level is applied to the reference voltage supply terminal VRB. Accordingly, the reference voltages Vref1 to Vref7 generated by the resistors-chain circuit 1 satisfy the relation of Vref1<Vref2<Vref3<Vref4<Vref5<Vref6<Vref7.

As in the case of FIG. 7, therefore, when Vref is each reference voltage (Vref1 to Vref7) inputted to the master comparator latch (100–106), the operation of the master comparator latch (100–106) will be defined as follows.

If Vin<Vref, a non-inverted output of the master comparator latch absorbs the current of Io.

If Vin>Vref, an inverted output of the master comparator latch absorbs the current of Io.

The operation of the A/D converter of the present embodiment 1 will now be explained.

In the present embodiment 1, the current value Is of the constant current sources 70 and 71 of the least significant bit D0 is set to Is=4Io, the current value Is of the constant current sources 72 and 73 of the intermediate bit D1 is set to Is=3Io, and the current value Is of the constant current sources 74 and 75 of the higher bit D2 is set to Is=2Io.

First, explanation will be made of the operation when the input analog voltage Vin is Vin<Vref1.

At this time, the non-inverted output of each of the master comparator latches 100 to 106 absorbs the current Io. From the constant current source 70, therefore, the current of Io flows into the non-inverted output of the master comparator latch 102 and the current of Io flows into the non-inverted output of the master comparator latch 106. The remaining current 2Io (=4Io−2Io) from the constant current source 70 flows through the load resistor 40.

Also, from the constant current source 71, the current of Io flows into the non-inverted output of the master comparator latch 100, the current of Io flows into the non-inverted output of the master comparator latch 104 and the current of Io flows into the constant current source 51. The remaining current Io (=4Io−3Io) from the constant current source 71 flows through the load resistor 41.

Accordingly, the load resistor 40 has a voltage drop of 2Io×R developed thereacross and the load resistor 41 has a voltage drop of Io×R developed thereacross. Consequently, voltages VD0N and VD0P generated at the load resistors 40 and 41 are VD0P<VD0N with a voltage difference of Io×R therebetween.

Similarly, from the constant current source 72, the current of Io flows into the non-inverted output of the master comparator latch 105. Therefore, the remaining current 2Io (=3Io−Io) from the constant current source 72 flows through the load resistor 42.

Also, from the constant current source 73, the current of Io flows into the non-inverted output of the master comparator latch 101 and the current of Io flows into the constant current source 50. The remaining current Io (=3Io−2Io) from the constant current source 73 flows through the load resistor 43.

Accordingly, the load resistor 42 has a voltage drop of 2Io×R developed thereacross and the load resistor 43 has a voltage drop of Io×R developed thereacross. Consequently, voltages VD1N and VD1P generated at the load resistors 42 and 43 are VD1P<VD1N with a voltage difference of Io×R therebetween.

Similarly, the current of Io flows from the constant current source 75 into the non-inverted output of the master comparator latch 103. The remaining current Io (=2Io−Io) from the constant current source 75 flows through the load resistor 45.

Also, the current of 2Io from the constant current source 74 flows through the load resistor 44.

Accordingly, the load resistor 44 has a voltage drop of 2Io×R developed thereacross and the load resistor 45 has a voltage drop of Io×R developed thereacross. Consequently, voltages VD2N and VD2P generated at the load resistors 44 and 45 are VD2P<VD2N with a voltage difference of Io×R therebetween.

Next, explanation will be made of the operation when the input analog voltage Vin is Vref1<Vin<Vref2.

At this time, from the constant current source 70, the current of Io flows into the non-inverted output of the master comparator latch 102, the current of Io flows into the non-inverted output of the master comparator latch 106 and the current of Io flows into the inverted output of the master comparator latch 100. The remaining current Io (=4Io−3Io) from the constant current source 70 flows through the load resistor 40.

Also, from the constant current source 71, the current of Io flows into the non-inverted output of the master comparator latch 104 and the current of Io flows into the constant current source 51. The remaining current 2Io (=4Io−2Io) from the constant current source 71 flows through the load resistor 41.

Accordingly, the load resistor 40 has a voltage drop of Io×R developed thereacross and the load resistor 41 has a voltage drop of 2Io×R developed thereacross. Consequently, voltages VD0N and VD0P generated at the load resistors 40 and 41 are VD0N<VD0P with a voltage difference of Io×R therebetween.

Currents flowing through the remaining load resistors 42 to 45 are the same as those in the foregoing case.

Next, explanation will be made of the operation when the input analog voltage Vin is Vref2<Vin<Vref3.

At this time, from the constant current source 72, the current of Io flows into the non-inverted output of the master comparator latch 105 and the current of Io flows into the inverted output of the master comparator latch 101. The remaining current Io (=3Io−2Io) from the constant current source 72 flows through the load resistor 42.

Also, the current of Io flows from the constant current source 73 into the constant current source 50 and the remaining current 2Io (=3Io−Io) from the constant current source 73 flows through the load resistor 43.

Accordingly, the load resistor 42 has a voltage drop of Io×R developed thereacross and the load resistor 43 has a voltage drop of 2Io×R developed thereacross. Consequently, voltages VD1N and VD1P generated at the load resistors 42 and 43 are VD1N<VD1P with a voltage difference of Io×R therebetween.

Currents flowing through the remaining load resistors 40, 41, 44 and 45 are the same as those in the foregoing case.

Next, explanation will be made of the operation when the input analog voltage Vin is further changed so that it is Vref4<Vin.

At this time, the current of Io flows from the constant current source 74 into the inverted output of the master comparator latch 103 and the remaining current Io (=2Io−Io) from the constant current source 74 flows through the load resistor 44.

Also, the current of 2Io from the constant current source 75 flows through the load resistor 45.

Accordingly, the load resistor 44 has a voltage drop of Io×R developed thereacross and the load resistor 45 has a voltage drop of 2Io×R developed thereacross. Consequently, voltages VD2N and VD2P generated at the load resistors 44 and 45 are VD2N<VD2P with a voltage difference of Io×R therebetween.

Figure 8:
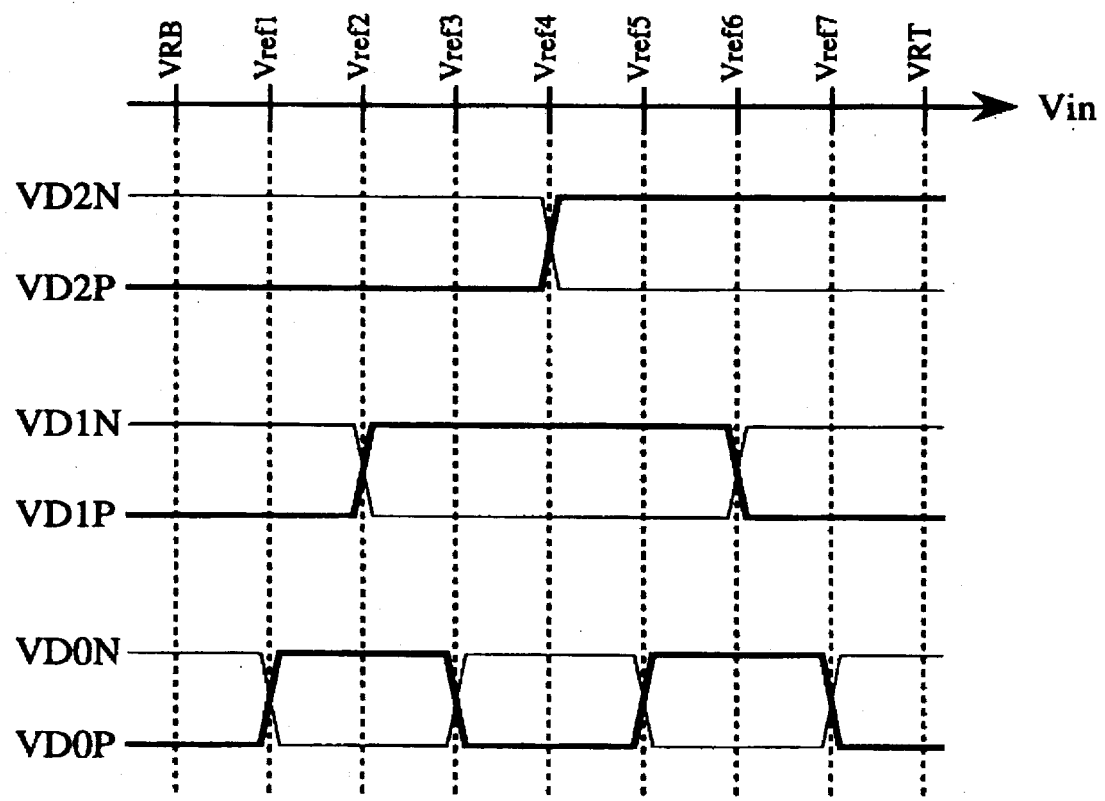
FIG. 8 shows a voltage change which is generated at each load resistor in the A/D converter of FIG. 7 in accordance with an input analog voltage (Vin).

Namely, according to the present embodiment 1, the voltage VD0P generated at the load resistor 41, the voltage VD1P generated at the load resistor 43 and the voltage VD2P generated at the load resistor 45 provide gray codes, as shown in FIG. 8, in accordance with the input analog voltage Vin.

The foregoing explanation has been made in conjunction with the case where the current value Is of the constant current sources 70 and 71 is set to Is=4Io, the current value Is of the constant current sources 72 and 73 is set to Is=3Io, and the current value Is of the constant current sources 74 and 75 is set to Is=2Io. However, it is apparent that the current value Is of the constant current sources 70 and 71 may be set to Is=3Io, the current value Is of the constant current sources 72 and 73 may be set to Is=2Io, and the current value Is of the constant current sources 74 and 75 may be set to Is=Io.

As explained in the above, in the present embodiment, current outputs superimposed in generating a logic voltage are not directly supplied to the load resistor (40–45) but a current corresponding to a difference between the constant current source (70–75) and a total current flowing to the master comparator latches (100–106) flows through the load resistor (40–45).

Since only the differential current flows through the load resistor, a large voltage drop in the prior art is not generated. Accordingly, the DC bias of the master comparator latch (100–106) has a margin so that it becomes possible to superimpose an increased number of master comparator latches, thereby realizing a high-resolution A/D converter.

[Embodiment 2]

Figure 3:
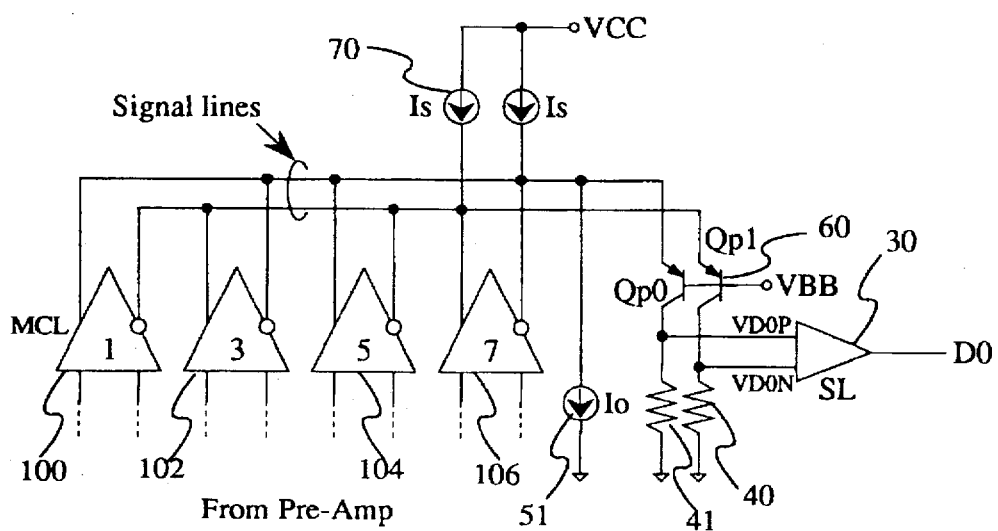
FIG. 3 is a circuit diagram showing the construction of only the least significant bit of a flash A/D converter with folded differential logic circuit according to another or second embodiment of the present invention.

FIG. 3 is a diagram showing the circuit construction of only the least significant bit of a flash A/D converter with folded differential logic circuit according to another or second embodiment of the present invention.

FIG. 3 too shows the A/D converter in conjunction with the case where an input analog signal is converted into a 3-bit digital signal.

In the present embodiment 2, an additional transistor 60 including base-common PNP transistors Qp0 and Qp1 having the bases applied with a bias voltage VBB is provided for fixing the potential of a current output superimposing signal line to the voltage of (VBE+VBB), where VBE is the base-emitter voltage of the additional transistor 60 and VBB is the base voltage of the additional transistor 60.

In the present embodiment 2 shown in FIG. 3, the potential of the signal line to the voltage of (VBE+VBB) but a differential current between the constant current source and a current corresponding to the outputs of the master comparator latches flows to the load resistor 40 or 41 through the emitter-collector path of the additional transistor 60. In substance, therefore, the circuit shown in FIG. 3 operates in a manner similar to that in the circuit shown in FIG. 1 or 2.

In the present embodiment 2, however, since the additional transistor 60 is interposed to fix the potential of the current output superimposing signal line, the additional transistor 60 prevents the formation of a time constant corresponding to the product of the parasitic capacitance of the signal line and the load resistor, thereby making it possible to prevent the high-speed transmission of superimposed signals from being deteriorated.

It will easily be understood that a P-channel MOS transistor having a gate applied with a bias voltage VBB can be used, as the additional transistor 60, in place of the PNP transistor used in the present embodiment 2.

[Embodiment 3]

Figure 4:
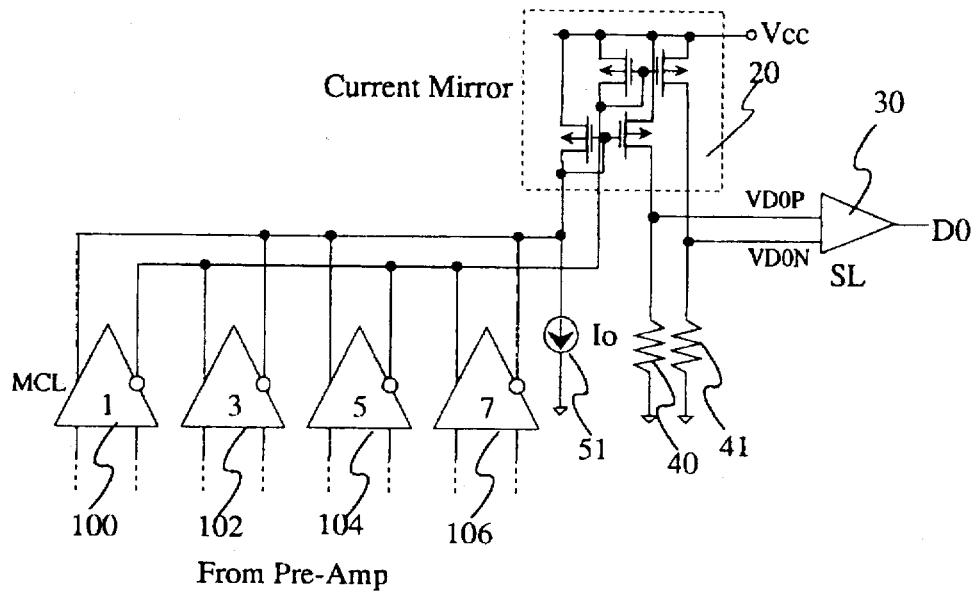
FIG. 4 is a circuit diagram showing the construction of only the least significant bit of a flash A/D converter with folded differential logic circuit according to a further or third embodiment of the present invention.

FIG. 4 is a diagram showing the circuit construction of only the least significant bit of a flash A/D converter with folded differential logic circuit according to a further or third embodiment of the present invention.

FIG. 4 too shows the A/D converter in conjunction with the case where an input analog signal is converted into a 3-bit digital signal.

In FIG. 4, reference numeral 20 denotes a current mirror circuit. In the present embodiment 3, the superimposed current outputs of the master comparator latches (100–106) are received by the current mirror circuit 20 and all of the superimposed currents are reflected or folded down by the current mirror circuit 20 to the load resistors (40–45).

Namely, a current on the signal line connected to the outputs of the master comparator latches flows through the source-drain path of a gate-drain shorted and diode-connected P-channel input MOS transistor on the input side of the current mirror circuit. A current proportional to the above current flows through the source-drain path of a P-channel output MOS transistor on the output side of the current mirror circuit.

For example, when the input analog voltage Vin is Vin<Vref1, the current of 2Io corresponding to the sum of the current of Io flowing into the non-inverted output of master comparator latch 102 and the current of Io flowing into the non-inverted output of master comparator latch 106 is reflected by the current mirror circuit 20 so that it flows through the load resistor 41. Also, the current of 3Io corresponding to the sum of the current of Io flowing into the non-inverted output of master comparator latch 100, the current of Io flowing into the non-inverted output of master comparator latch 104 and the current of Io flowing into the constant current source 51 is reflected by the current mirror circuit 20 so that it flows through the load resistor 40.

Accordingly, a voltage VD0N generated at the load resistor 40 is 3Io×R and a voltage VD0P generated at the load resistor 41 is 2Io×R. Consequently, the voltages VD0N and VD0P generated at the load resistors 40 and 41 are VD0P<VD0N with a voltage difference of Io×R therebetween.

The input side of the current mirror circuit 20 is constructed by a diode-connected active element such as a gate-drain shorted and diode-connected MOS transistor or a base-collector shorted and diode-connected bi-polar transistor. This diode-connected active element operates as a non-linear element. Therefore, a voltage drop is not proportional to a current or is non-linear to the current. As a result, this diode-connected active element operates as a voltage clamp element and hence there is not generated a large voltage drop which may be caused when the load resistor is directly driven.

On the other hand, a voltage drop proportional to a current is generated across the load resistor (40, 41) on the output side of the current mirror circuit 20. However, the output side of the current mirror circuit 20 gives no substantial influence on the input side thereof.

Accordingly, in the present embodiment 3 too, the DC bias of the master comparator latch (100–106) has a margin as in the above-mentioned case where only the differential current is folded. Thereby, it becomes possible to superimpose an increased number of master comparator latches.

[Embodiment 4]

Figure 5:
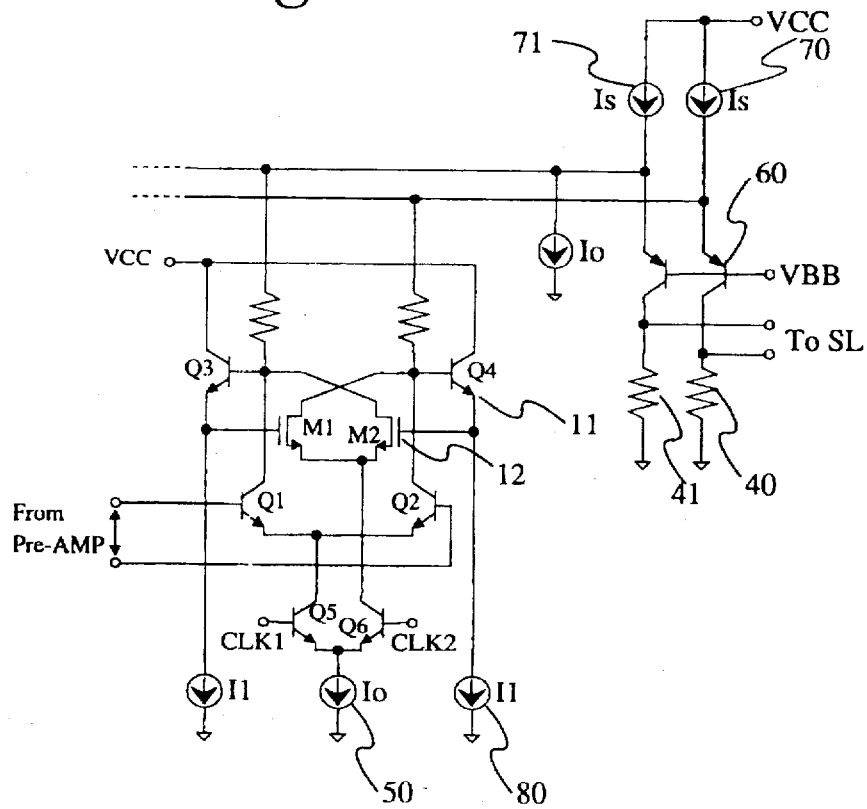
FIG. 5 is a diagram showing an example of the circuit construction of a master comparator latch (100–106) used in the flash A/D converter in each of the embodiments of the present invention.

FIG. 5 is a diagram showing an example of the circuit construction of the master comparator latch (100–106) used in the flash A/D converter of the foregoing embodiments of the present invention.

In the present embodiment 4, a master comparator latch (100–106) using a Bi-CMOS process is used as the master comparator latch (100–106) in the embodiment 2.

In FIG. 5, when a clock signal CLK1 takes a "high" level, an amplifier mode is assumed. At this time, a transistor Q5 is turned on so that one of bi-polar transistors Q1 and Q2 is turned on in accordance with an output signal or an inverted output signal from the pre-amplifier 5 to absorb the current of Io.

When a clock signal CLK2 takes a "high" level, a latch mode is assumed. At this time, a transistor Q6 is turned on to latch the condition of the bi-polar transistor Q1 or Q2 turned on at the time of the amplifier mode.

Thus, the transistors Q5 and Q6 and the transistors Q1 and Q2 form an ECL series gate.

In this case, a transistor (M1, M2) activated in the latch mode is generally constructed by a bi-polar transistor. In the present embodiment, however, the transistor (M1, M2) is particularly constructed by a MOS transistor.

In the case where the transistor activated in the latch mode is a bi-polar transistor having a vertical structure, the operating speed is deteriorated due to a large collector-substrate capacitance (Csub).

On the other hand, in the case where the transistor activated in the latch mode is constructed by a MOS transistor having a lateral structure, the operating speed is improved since the collector-substrate capacitance is very small.

Figure 6:
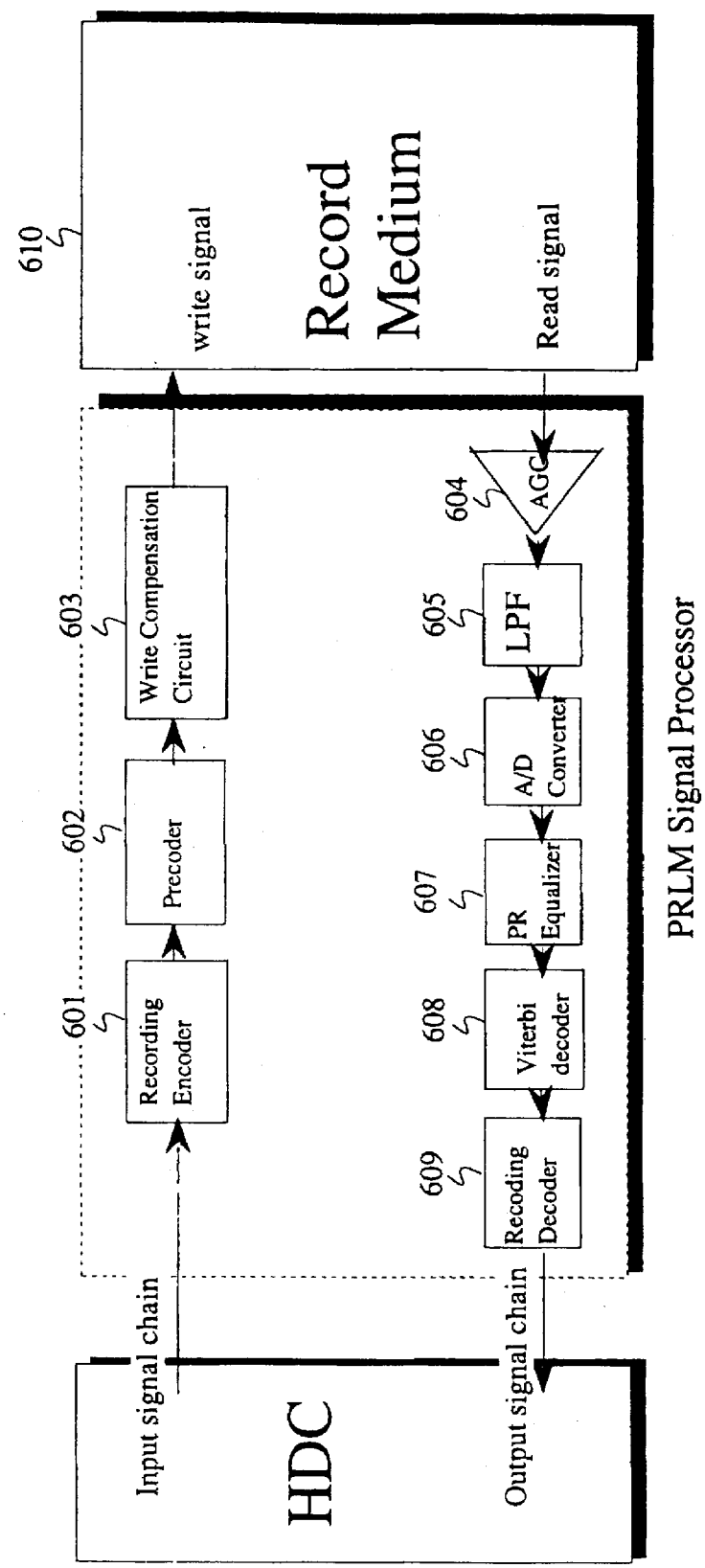
FIG. 6 is a diagram for explaining the outline of a PRML signal processing circuit.

It is needless to say that the flash A/D converters shown in the foregoing embodiments are applicable to the PRML signal processing shown in FIG. 6.

Though the present invention has specifically been described on the basis of the embodiments, it is needless to say that the invention is not limited to the embodiments and various changes or modifications can be made within a scope which does not depart from the gist of the invention.

Effects obtained by typical ones of the inventions disclosed by the present application can be summarized as follows.

(1) According to the present invention, a reduction in power consumption in a flash A/D converter is possible and it is possible to superimpose an increased number of comparators.

(2) According to the present invention, the influence of a parasitic capacitance of a signal line in a flash A/D converter can be eliminated, thereby making it possible to prevent the high-speed transmission of superimposed signals from being deteriorated.

We claim:

1. A flash A/D converter comprising:

a plurality of master comparators for comparing a plurality of reference voltages and an input analog signal to absorb a current with a constant value from a non-inverted output or inverted output of each of said master comparators in accordance with a relation in magnitude between said reference voltage and said input analog signal;

a plurality of slave comparators having inputs thereof selectively coupled to the non-inverted outputs or inverted outputs of said plurality of master comparators through a plurality of signal lines, said plurality of slave comparators outputting desired digital signals;

a plurality of constant current sources coupled to said plurality of signal lines, respectively; and a plurality of load resistors having their first ends coupled to said plurality of signal lines respectively and their second ends opposite to the first ends, wherein a common DC bias voltage is applied to the second ends of said plurality of load resistors and wherein the constant current value of one of said plurality of constant current sources coupled to the signal line coupled to the input of the slave comparator of a lower bit side is set to a value larger than that of one of said plurality of constant current sources coupled to the signal line coupled to the input of the slave comparator of a higher bit side.

2. A flash A/D converter according to claim 1, wherein said plurality of signal lines are coupled to the first ends of said plurality of load resistors and the inputs of said plurality of slave comparators through a plurality of additional base-common transistors.

3. A flash A/D converter according to claim 1, wherein said plurality of master comparators and said plurality of slave comparators include ECL series gate circuits.

4. A flash A/D converter according to claim 2, wherein said plurality of master comparators and said plurality of slave comparators include ECL series gate circuits.

5. A flash A/D converter comprising:

a plurality of master comparators for comparing a plurality of reference voltages and an input analog signal to absorb a current with a constant value from a non-inverted output or inverted output of each of said master comparators in accordance with a relation in magnitude between said reference voltage and said input analog signal;

a plurality of signal lines selectively coupled to the non-inverted outputs or inverted outputs of said plurality of master comparators;

a plurality of current mirror circuits having inputs coupled to said plurality of signal lines;

a plurality of load resistors having their first ends coupled to the outputs of said plurality of current mirror circuits and their second ends coupled to a reference potential point; and a plurality of slave comparators having inputs thereof coupled to the outputs of said plurality of current mirror circuits and the first ends of said plurality of load resistors, said plurality of slave comparators outputting desired digital signals.

6. A flash A/D converter according to claim 1, wherein in an ECL series gate circuit of said plurality of master comparators, a positive feedback of latch is performed by a pair of MOS transistors with lateral structure.

7. A signal processing circuit for reading a signal from a magnetic record medium and processing the read signal, wherein the circuit comprises the flash A/D converter according to any one of claims 1 to 6 as an A/D converter for A/D converting the read signal.

* * * * *